United States Patent [19]
Pham

[11] Patent Number: 5,258,726
[45] Date of Patent: Nov. 2, 1993

[54] VOLTAGE CONTROLLED OSCILLATOR WITH LOW OPERATING SUPPLY VOLTAGE

[75] Inventor: Phuc C. Pham, Chandler, Ariz.

[73] Assignee: Motorola, Inc., Schaumburg, Ill.

[21] Appl. No.: 968,136

[22] Filed: Oct. 29, 1992

[51] Int. Cl.$^5$ ............................................. H03B 5/12
[52] U.S. Cl. .................................. 331/117 R; 331/74; 331/177 V; 331/177 R
[58] Field of Search ............. 331/74, 116 K, 116 FE, 331/117 R, 117 FE, 177 R, 177 V

[56] References Cited

U.S. PATENT DOCUMENTS

| | | | |
|---|---|---|---|
| 4,591,809 | 5/1986 | Regan et al. | 331/117 R |
| 4,602,221 | 7/1986 | Regan et al. | 331/117 R |
| 5,107,228 | 4/1992 | Pham et al. | 331/117 R |

FOREIGN PATENT DOCUMENTS 0116060  10/1978  Japan .............................. 331/117 R

OTHER PUBLICATIONS

Spencer, T. "V.H.F. Solid-State Power Amplifier Design" *Electronic Engineering,* Feb. 1967 pp. 72-77.

*Primary Examiner*—David Mis
*Attorney, Agent, or Firm*—Bradely J. Botsch, Sr.

[57] ABSTRACT

A voltage controlled oscillator (VCO) circuit (10) for operating at low supply voltages has been provided. The VCO circuit includes an oscillation stage which utilizes a negative resistance technique for oscillation and includes a first inductor (38) for allowing the oscillation stage to operate at low supply voltages. The VCO circuit also includes an output stage which includes a second inductor (52) and a first capacitor (51) for allowing the output resistance of the VCO circuit to be adjusted for maximum output drive capability.

7 Claims, 1 Drawing Sheet

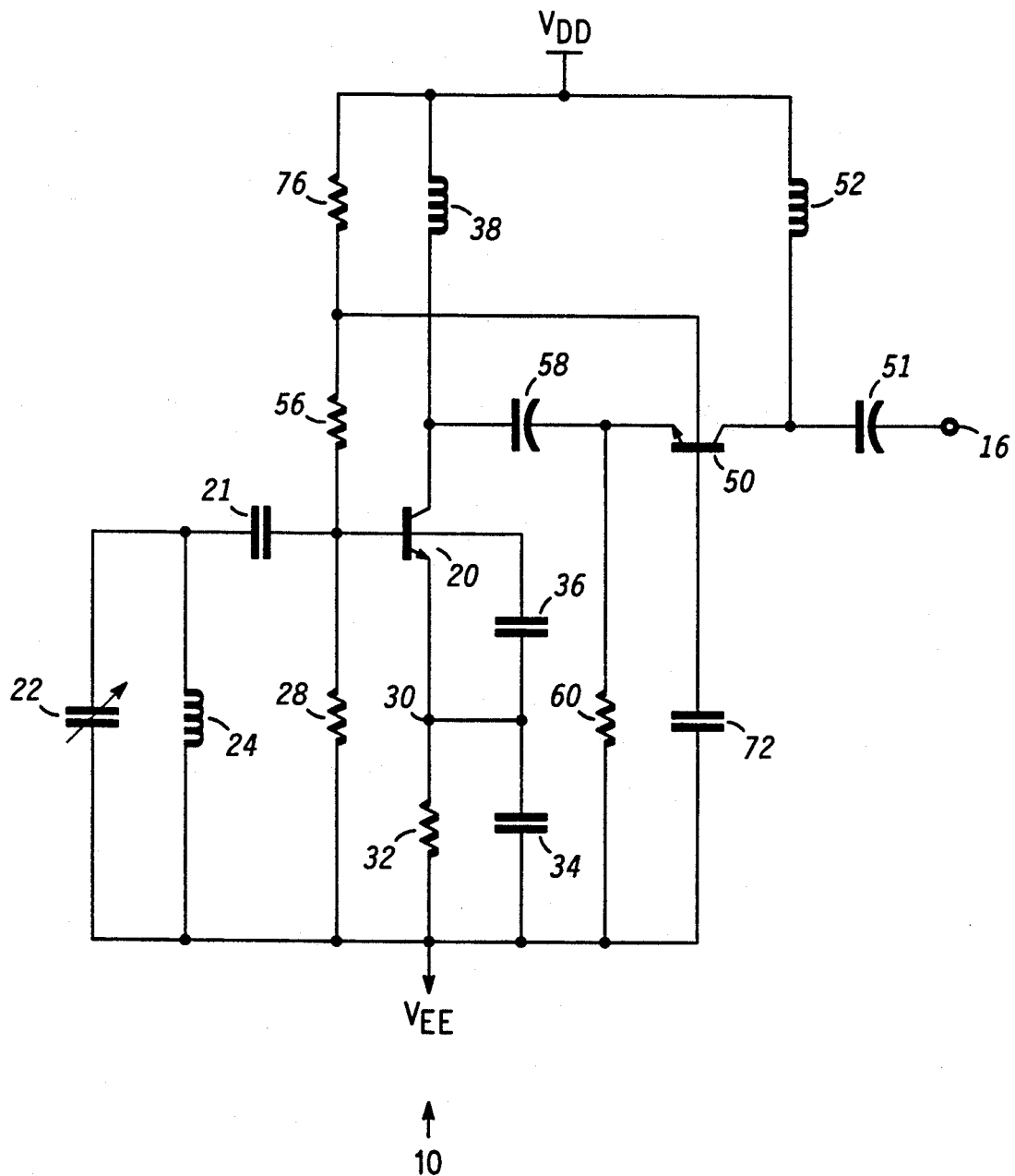

VOLTAGE CONTROLLED OSCILLATOR WITH LOW OPERATING SUPPLY VOLTAGE

FIELD OF THE INVENTION

This invention relates to oscillators, for example, a voltage controlled oscillator circuit for operating at low supply voltages.

BACKGROUND OF THE INVENTION

Voltage controlled oscillator (VCO) circuits are well known in the art and are utilized in a number of applications, for example, within a phase-locked loop. A VCO circuit typically includes a variable element such as a capacitor that may be varied to adjust the frequency of an output signal of the VCO circuit.

A VCO circuit typically includes some type of output stage such that the output impedance of the VCO circuit is a suitable value. An output stage that is coupled to an oscillator circuit via a coupling capacitor is disclosed in U.S. Pat. No. 5,107,228 and having an issue date of Apr. 21, 1992. This patent discloses a VCO circuit having an output amplifier for providing an adjustable output impedance. However, the circuits shown in FIGS. 1 and 2 have a common emitter output stage which does not provide high gain amplification. Further, the circuits shown in FIGS. 1 and 2 require a separate bias current for both the output amplifier and the oscillation stage and, thus, are not power efficient.

Hence, there exists a need to provide an improved VCO circuit having an output stage with an adjustable output impedance for operating at low supply voltages.

BRIEF DESCRIPTION OF THE DRAWING

The sole FIGURE is a detailed schematic diagram illustrating a voltage controlled oscillator circuit for operating at low supply voltages in accordance with the present invention.

DETAILED DESCRIPTION OF THE DRAWING

Referring to the sole FIGURE, a detailed schematic diagram illustrating voltage controlled oscillator (VCO) circuit 10 having an output at terminal 16 is shown. VCO circuit 10 comprises an oscillator stage which includes oscillator transistor 20 which has a base coupled through capacitor 21 to first terminals of parallel connected variable capacitor 22 and inductor 24. The second terminals of capacitor 22 and inductor 24 are coupled to a first supply voltage terminal at which the potential $V_{EE}$ is applied. Capacitor 21 provides a DC block to prevent leakage current from capacitor 22 and inductor 24 from flowing into the base of transistor 20.

The base of transistor 20 is also coupled through resistor 28 to the first supply voltage terminal. The base of transistor 20 is also coupled through capacitor 36 to circuit node 30 wherein capacitor 36 minimizes the variation in the base-emitter capacitance of transistor 20. The emitter of transistor 20 is coupled to circuit node 30 wherein resistor 32 and capacitor 34 are coupled in parallel between circuit node 30 and the first supply voltage terminal. The collector of transistor 20 represents an output of the oscillator stage. The collector of transistor 20 is also coupled through inductor 38 to a second supply voltage terminal at which the operating potential $V_{DD}$ is applied.

VCO circuit 10 also includes a common base output buffer stage which includes transistor 50 having a collector, which represents the output of the output buffer stage, coupled through capacitor 51 to terminal 16. The collector of transistor 50 is also coupled through inductor 52 to operating potential $V_{DD}$. The base of transistor 50 is coupled through resistor 56 to the base of transistor of 20. Further, the base of transistor of 50 is coupled through resistor 76 to operating potential $V_{DD}$. The emitter of transistor 50, which represents the input of the output buffer stage, is coupled through capacitor 58 to the collector of transistor 20. Further, the emitter of transistor 50 is coupled through resistor 60 to operating potential $V_{EE}$. The base of transistor 50 is coupled through capacitor 72 to operating potential $V_{EE}$.

In operation, the oscillation stage comprises transistor 20, resistors 28 and 32, capacitors 21, 22, 34 and 36 and inductors 24 and 38. Resistor 28 (in conjunction with resistors 56 and 76) form a bias network for providing predetermined bias voltages at the bases of transistors 20 and 50. These predetermined bias voltages provide a predetermined current to flow through transistors 50 and 20.

VCO circuit 10 will oscillate if the total resistance in the loop formed by inductor 24, capacitors 21, 22, 34 and 36, transistor 20 and the parallel combination of reistor 32 and capacitor 34 is negative. This is based on the fact that an ideal tuned circuit will oscillate-indefinitely if there is no resistance element present to dissipate energy. Thus, VCO circuit 10 will oscillate if the real part of the input impedance of transistor 20 is sufficiently negative to yield an overall negative resistance for the loop.

The analysis of calculating the input resistance of transistor 20 is discussed in detail on pages 243-245 of "Modern Communication Circuits", McGraw-Hill Publishing Co., 1985. The final result for the real part of the input impedance ($r_i$) of transistor 20 is shown in EQN. 1.

$$r_i = -g_m/(w^2 \times (C_{BE} + C_{36}) \times C_E) \qquad (1)$$

where
$g_m$ is the transconductance of transistor 20;
w is the operating frequency;
$C_{BE}$ is the base-emitter capacitance of transistor 20;
$C_{36}$ is the capacitance of capacitor 36; and
$C_E$ the capacitance seen at the emitter of transistor 20.

It must be understood that if the magnitude of $r_i$ as shown in EQN. 1 is greater than the sum of any other resistances within the loop, then transistor 20 will be able to supply the dissipated energy of the inductor (or capacitor). Thus, VCO circuit 10 will be able to sustain oscillation.

As a result, the signal appearing at the collector of transistor 20 is an oscillatory signal which oscillates at a center frequency ($F_C$) substantially equal to $[2 \times pi \times (L \times C_{equiv})^{-\frac{1}{2}}]$ where pi=3.1415927, L is the inductance of inductor 24 and $C_{equiv}$ is the equivalent capacitance of the loop as expressed in EQN. 2.

$$C_{equiv} = C_{22} + C_{21} \| [(C_{BE20} + C_{36}) \| C_{34} + C_{CB20} \| (C_{CS20} + C_{58} \| C_{72} \| C_{BE50})] \qquad (2)$$

where
$C_{BE20}$ is the base-emitter capacitance of transistor 20;
$C_{CB20}$ is the collector-base capacitance of transistor 20;
$C_{CS20}$ is the collector-substrate capacitance of transistor 20;

$C_{BE50}$ is the base-emitter capacitance of transistor 50; and

|| means "in parallel with".

It should be understood that by varying the value of capacitor 22, the equivalent capacitance as expressed in EQN. 2 is varied thereby varying the center frequency of the signal appearing at the collector of transistor 20. Further, it is worth noting that capacitor 22 may take the form of a varactor wherein adjusting the voltage applied across the varactor will adjust the center frequency.

The common base output buffer stage includes transistor 50, resistor 60, and capacitor 72 wherein it is understood that resistors 28, 56 and 76 provide a predetermined bias voltage at the base of transistor 50 as aforedescribed. It is important to realize that by providing the same bias network to bias the bases of transistors 20 and 50, the total power consumption of the VCO circuit is reduced. The common base output buffer stage has an input at the emitter of transistor 50, and an output at the collector of transistor 50 wherein transistor 50 acts as a current buffer by transferring the oscillatory signal appearing at the collector of transistor 20 to output terminal 16. Transistor 50 also provides a low impedance (its emitter resistance $-r_e$) at the collector of transistor 20 which reduces the miller multiplier effect of the collector-base capacitance of transistor 20 thereby extending the upper cutoff frequency of VCO circuit 10.

Capacitor 72 is a stability capacitor for the output buffer stage, while resistor 60 completes a bias current path from operating potential $V_{DD}$, inductor 52, transistor 50 and resistor 60.

Inductor 38 provides both impedance matching and a path for the collector voltage of transistor 20. It is worth noting that by utilizing inductor 38, the collector of transistor 20 is allowed to swing around voltage $V_{CC}$ without saturating transistor 20. Moreover, inductor 38 also allows VCO circuit 10 to operate at lower supply voltages because of the low internal resistance associated with inductor 38.

Matching elements 51 and 52 can be utilized to provide a predetermined resistance at the output of VCO circuit 10 (terminal 16). Further, inductor 52 also provides a bias for the collector of transistor 50 similar to inductor 38 which provided a bias for the collector of transistor 20 as described above. The calculation of the output resistance ($R_{OUT}$) of VCO circuit 10 is quite complex and, thus, a simplified expression is not included. However, actual test results indicate that by varying the value of inductor 52 or capacitor 51, the output resistance at terminal 16 may be adjusted to a predetermined value, for example, 50 ohms.

In summary, the output resistance seen from looking in from terminal 16 can be adjusted via matching elements 51 and 52. Thus, output impedance of VCO circuit 10 of FIG. 1 can be designed to match the input impedance of a circuit (not shown) coupled to terminal 16 for maximum drive capability. Further, VCO circuit 10 includes a common base output buffer stage thereby providing minimum power dissipation and better high frequency performance.

By now it should be apparent from the foregoing discussion that a novel voltage controlled oscillator (VCO) circuit for operating at low supply voltages has been provided. The VCO circuit includes an oscillation stage which utilizes a negative resistance technique for oscillation and includes a first inductor for allowing the oscillation stage to operate at low supply voltages. The VCO circuit also includes an output stage which includes a second inductor and a capacitor for allowing the output resistance of the VCO circuit to be adjusted for maximum output drive capability.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

I claim:

1. A voltage controlled oscillator circuit having an output, comprising;
   (a) an oscillation stage having an oscillation loop having a total negative resistance such that said oscillation stage provides an oscillation signal having a predetermined frequency at an output, said oscillation stage including:
      (i) a first transistor within said oscillation loop, said first transistor having first and second current carrying electrodes and a control electrode, said first and second current carrying electrodes being coupled between said output of said oscillation stage and a first supply voltage terminal, said control electrode of said first transistor being coupled to receive a first bias voltage; and
      (ii) a first inductor coupled between said output of said oscillation stage and a second supply voltage terminal for allowing said first transistor to operate at low supply voltages;
   (b) an output stage for transferring said oscillation signal from said output of said oscillation stage to the output of the voltage controlled oscillator circuit, said output stage including:
      (i) a second transistor having first and second current carrying electrodes and a control electrode, said second current carrying electrode being capacitively coupled to said output of said oscillation stage, said control electrode of said second transistor being coupled to receive a second bias voltage;
      (ii) a second inductor being coupled between said second supply voltage terminal and said first current carrying electrode of said second transistor; and
      (iii) a first capacitor being coupled between said first current carrying electrode of said second transistor and the output of the voltage controlled oscillator circuit.

2. The voltage controlled oscillator circuit according to claim 1 wherein said oscillation stage further includes:
   a third inductor having first and second terminals, said second terminal of said third inductor being coupled to said first supply voltage terminal;
   a second capacitor having first and second terminals, said first terminal of said second capacitor being coupled to said first terminal of said third inductor, said second terminal of said second capacitor being coupled to said first supply voltage terminal;
   a third capacitor being coupled between said first terminal of said third inductor and said control electrode of said first transistor;
   a first resistor coupled between said second current carrying electrode of said first transistor and said first supply voltage terminal;

a second resistor coupled between said control electrode of said first transistor and said first supply voltage terminal; and a fourth capacitor being coupled between said second current carrying electrode of said first transistor and said first supply voltage terminal.

3. The voltage controlled oscillator circuit according to claim 2 wherein said oscillation stage still further includes a fifth capacitor coupled across said control and second current carrying electrodes of said first transistor.

4. The voltage controlled oscillator circuit according to claim 1 wherein said output stage further includes:

a first resistor being coupled between said second current carrying electrode of said second transistor and said first supply voltage terminal; and a second capacitor being coupled between said control electrode of said second transistor and said first supply voltage terminal.

5. The voltage controlled oscillator circuit according to claim 1 wherein said second inductor and said first capacitor are utilized to provide a predetermined resistance at the output of the voltage controlled oscillator circuit.

6. A voltage controlled oscillator circuit having an output, comprising:

a first transistor having a collector, a base and an emitter;

a second transistor having a collector, a base and an emitter, said collector of said second transistor being coupled to the output of the voltage controlled oscillator circuit;

a first inductor having first and second terminals, said first terminal of said first inductor being coupled to said collector of said first transistor, said second terminal of said first inductor being coupled to a first supply voltage terminal;

a second inductor having first and second terminals, said first terminal of said first inductor being coupled to said collector of said second transistor, said second terminal of said second inductor being coupled to said first supply voltage terminal;

a first capacitor having first and second terminals, said first terminal of said first capacitor being coupled to said base of said first transistor;

a second capacitor having first and second terminals, said first terminal of said second capacitor being coupled to said second terminal of said first capacitor, said second terminal of said second capacitor being coupled to a second supply voltage terminal;

a third inductor having first and second terminals, said first terminal of said third inductor being coupled to said second terminal of said first capacitor, said second terminal of said third inductor being coupled to said second supply voltage terminal;

a third capacitor having first and second terminals, said first terminal of said third capacitor being coupled to said emitter of said first transistor, said second terminal of said third capacitor being coupled to said second supply voltage terminal;

a fourth capacitor being coupled between said collector of said first transistor and said emitter of said second transistor;

a fifth capacitor being coupled between said base of said second transistor and said second supply voltage terminal;

a first resistor coupled between said emitter of said first transistor and said second supply voltage terminal;

a second resistor being coupled between said bases of said first and second transistors;

a third resistor being coupled between said emitter of said second transistor and said second supply voltage terminal;

a fourth resistor being coupled between said base of said second transistor and said first supply voltage terminal; and a fifth resistor being coupled between said base of said first transistor and said second supply voltage terminal.

7. The voltage controlled oscillator circuit according to claim 6 further including a sixth capacitor being coupled between said base of said first transistor and said emitter of said first transistor.

* * * * *